(12) United States Patent
Rentala et al.

(10) Patent No.: US 7,764,210 B2
(45) Date of Patent: Jul. 27, 2010

(54) SYSTEM AND METHOD FOR CONVERTING AN INPUT SIGNAL

(75) Inventors: Vijaya B. Rentala, Plano, TX (US); Baher Haroun, Allen, TX (US); Bo Xia, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 47 days.

(21) Appl. No.: 11/642,133

(22) Filed: Dec. 20, 2006

(65) Prior Publication Data

US 2008/0150650 A1 Jun. 26, 2008

(51) Int. Cl.
*H03M 1/66* (2006.01)
(52) U.S. Cl. .................... 341/144; 341/153
(58) Field of Classification Search .......... 341/144–172
See application file for complete search history.

(56) References Cited

U.S. PATENT DOCUMENTS

| 4,798,982 | A | | 1/1989 | Voorman | |
|---|---|---|---|---|---|
| 5,652,546 | A | * | 7/1997 | Dent | 330/276 |
| 6,707,407 | B2 | * | 3/2004 | Troy et al. | 341/143 |
| 6,747,510 | B2 | * | 6/2004 | Jantzi et al. | 330/51 |
| 7,034,610 | B2 | * | 4/2006 | Jantzi et al. | 330/51 |
| 2003/0146775 | A1 | * | 8/2003 | Levin et al. | 326/30 |
| 2007/0090875 | A1 | * | 4/2007 | McLachlan et al. | 330/86 |
| 2007/0273444 | A1 | * | 11/2007 | Bajdechi et al. | 330/260 |

OTHER PUBLICATIONS

Marcel J.M. Pelgrom, et al., "Matching Properties of MOS Transistors", IEEE Journal of Solid-State Circuits, vol. 24, No. 5, Oct. 1989, pp. 1433-1440.
Bram Nauta, et al., "Analog Line Driver with Adaptive Impedance Matching", IEEE Journal of Solid-State Circuits, vol. 33, No. 12, Dec. 1988, pp. 1992-1998.
Chi-Hung Lin, et al., "A 10-b, 500-Msample/s CMOS DAC in 0.6 $mm^2$", IEEE Journal of Solid-State Circuits, vol. 33, No. 12, Dec. 1988, pp. 1948-1958.
Jose Bastos, et al., "A 12-Bit Intrinsic Accuracy High-Speed CMOS DAC", IEEE Journal of Solid-State Circuits, vol. 33, No. 12, Dec. 1988, pp. 1959-1969.
Takahiro Miki, et al., "An 80-MHz 8-bit CMOS D/A Converter", IEEE Journal of Solid-State Circuits, vol. sc-21, No. 6, Dec. 1986, pp. 983-988.
Gabriel A. Rincon-Mora, "Active Capacitor Multiplier in Miller-Compensated Circuits", IEEE Transactions on Solid-State Circuits, vol. 35, No. 1, Jan. 2000, pp. 26-32.
Joseph N. Babanezhad, "A 100-MHz, 50-Ω, -45-dB Distortion, 3.3-V CMOS Line Driver for Ethernet and Fast Ethernet Networking Applications", IEEE Journal of Solid-State Circuits, vol. 34, No. 8, Aug. 1999, pp. 1044-1050.

(Continued)

*Primary Examiner*—Lam T Mai
(74) *Attorney, Agent, or Firm*—Ronald O. Neerings; Wade James Brady, III; Frederick J. Telecky, Jr.

(57) ABSTRACT

A video driver includes a current-to-voltage converter circuit that converts an analog input current to a corresponding analog voltage. Active termination circuitry is configured to synthesize an output impedance at an output thereof that substantially matches a load impedance to which the output is coupled, the active termination circuitry buffering the analog voltage to the output.

15 Claims, 2 Drawing Sheets

OTHER PUBLICATIONS

Publication Dallas Semiconductor MAXIM, "Reduced Termination Loss by Active Synthesis of Output Impedance", Nov. 4, 2004.

Publication Analog Devices, "2.7V to 5.5V RGB-to-NTSC/PAL Encoder with Load Detect and Input Termination Switch", http://www.analog.com, Analog Devices, Inc., 2000, pp. 1-20.

Rajeevan Mahadevan, et al., "A Differential 160-MHz Self-Terminating Adaptive CMOS Line Driver", IEEE Journal of Solid-State Circuits, vol. 5, No. 12, Dec. 2000, pp. 1889-1894.

Marcel J.M. Pelgrom, A 10-b 50-MHz CMOS D/A Converter with 75-$\Omega$ Buffer, IEEE Journal of Solid-State Circuits, vol. 25, No. 6, Dec. 1990, pp. 1347-1352.

* cited by examiner

SYSTEM AND METHOD FOR CONVERTING AN INPUT SIGNAL

TECHNICAL FIELD

This invention relates to an analog video system.

BACKGROUND

One common type of video system architecture includes a video encoder that provides a corresponding digital video signal to a digital-to-analog converter (DAC). The DAC converts the digital input signal to a corresponding analog signal format. Existing and future performance demands, such as can enable studio quality video, can require that the DAC should be at least 10-bit DAC and have linearity that is at least 50 dB. Performance requirements can also necessitate that the DAC operate at a relatively high clock rate, such as of up to 60 MHz or higher.

One challenge in designing a video amplifier is to provide a large output swing for the high-bandwidth video signal while also maintaining adequate linearity. Another consideration for the output buffer is matching the output impedance of the buffer with the load impedance. For example, impedance matching to the load (e.g. about 75Ω) is required to avoid reflections from the load at high frequencies such as are typically utilized in video frequencies. One common approach to achieve impedance matching is either by having a 75Ω in series with the load or by having 75Ω in parallel to the load. Each of these approaches, however, is not power and area efficient. For instance, these approaches typically require more external components than may be desirable in many applications.

The increasing demands of manufacturers to minimize cost while maintaining or improving performance have prompted significant design efforts and new manufacturing techniques. For example, many integrated circuits for video systems are being manufactured using ultra deep submicron processes. Circuits produced by such processes impose additional design considerations due to the requirement of low power consumption as well as substrate and supply rejection. The associated complexity of design and manufacture of such components is compounded in circumstances when having to design such a system with substantially zero-cost passive components (e.g., resistors and capacitors) in a base line CMOS process.

SUMMARY

One embodiment of the present invention provides a video driver that includes a current-to-voltage converter circuit that converts an analog input current to a corresponding analog voltage. Active termination circuitry is configured to synthesize an output impedance at an output thereof that substantially matches a load impedance to which the output is coupled, the active termination circuitry buffering the analog voltage to the output.

Another embodiment of the present invention provides an integrated on-chip system that includes means for converting a digital input signal to a corresponding analog current. The system also includes means for converting the analog current to a corresponding analog voltage. The system also includes means for actively matching impedance at an output of the system with a load impedance and for providing an output voltage at the output corresponding to a buffered indication of the corresponding analog voltage. The means for converting and the means for actively matching share at least one component in the integrated on-chip system.

Another embodiment of the present invention provides a method for driving a video signal to an output. The method includes converting a digital input signal, by a first on-chip converter, to a corresponding analog current based on a reference current. The analog current is converted, by an on chip current-to-voltage converter, to a corresponding analog voltage at a feedback node based on a voltage across an on-chip resistor. Impedance at the output is actively matched, by on-chip circuitry, and providing an analog output voltage at the output by buffering the corresponding analog voltage at the feedback node to the output.

DETAILED DESCRIPTION

Figure 1:
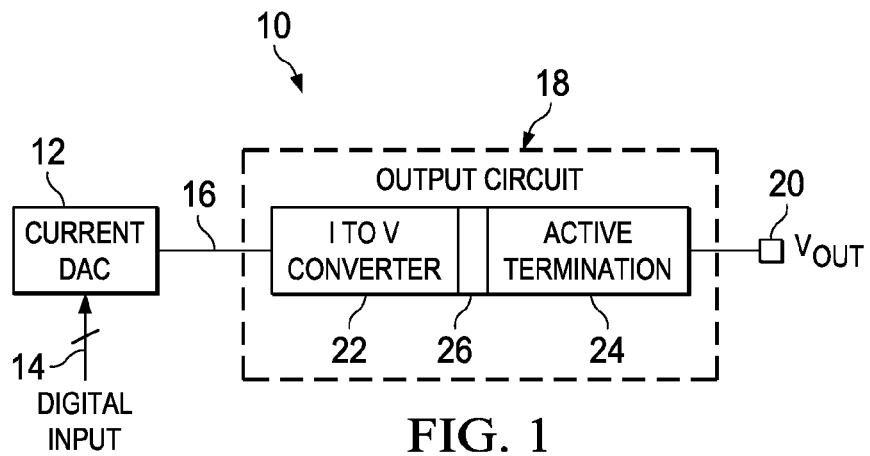
FIG. 1 illustrates an example of a schematic block diagram of a video driver system that can be implemented in accordance with an aspect of the invention.

FIG. 1 depicts a block diagram of a video system 10 according to an aspect of the present invention. The system 10 includes a digital-to-analog converter (DAC) 12 that converts a digital input signal 14 to a corresponding analog output signal 16. For instance, the input signal 14 can be a multi-bit video signal having N bits, where N is a positive integer (e.g., N=10 or more bits), according to performance and specification requirements. The input signal 14 can be generated by a video encoder, which can be implemented within the same integrated circuit as the DAC 12 and an output circuit 18. The DAC 12 can be implemented as a current steering DAC that provides the output signal as a corresponding analog current ($I_{DAC}$).

The output circuit 18 can be implemented as a video driver that is configured to perform current-to-voltage conversion of the $I_{DAC}$ signal as well as to perform active impedance matching at an output 20 thereof. The output circuit 18 provides an analog output voltage ($V_{OUT}$) to drive a load (not shown) that is coupled at an output thereof. The output signal $V_{OUT}$ corresponds to the input current $I_{DAC}$ that is provided by the DAC 12. As shown in FIG. 1, the output circuit 18 includes a current-to-voltage converter 22. For example, the current-to-voltage converter 22 can be implemented as a loop that converts the analog current $I_{DAC}$ to a corresponding voltage at an internal node thereof. Active termination circuitry 24 is configured to synthesize an output impedance at the output 20 that substantially matches a load impedance to which the output is coupled. For example, the active termination circuitry 24 can be a hybrid circuit configured to match the output impedance at 20 with a line impedance (e.g., about 75Ω).

As schematically indicated at 26, part of the active termination circuitry 24 is shared by the current-to-voltage converter 22, thereby achieving additional efficiencies in fabrication. For example, the current-to-voltage conversion can be implemented across an integrated resistor (e.g., an NWELL resistor in a CMOS process), which resistor also forms part of the active termination circuitry 24. Advantageously, the active termination circuitry 24 can be designed so as not to consume power, but still provide an output impedance that is substantially equal to the load impedance. Such active impedance matching can avoid reflections from the load at high frequencies like the video frequencies.

The system 10 can be implemented as a system on chip (SOC), including the DAC 12 and at least a substantial portion of the output circuit 18. The on-chip integration of the current-to-voltage conversion and active impedance matching affords advantages in terms of both area and power. The approach shown and described in FIG. 1 can also provide large output swing for the high-bandwidth video signal while maintaining excellent linearity. Additional benefits associated with the approach shown and described in FIG. 1 will be better appreciated with reference to other example embodiments shown in FIGS. 2 and 3.

Figure 2:
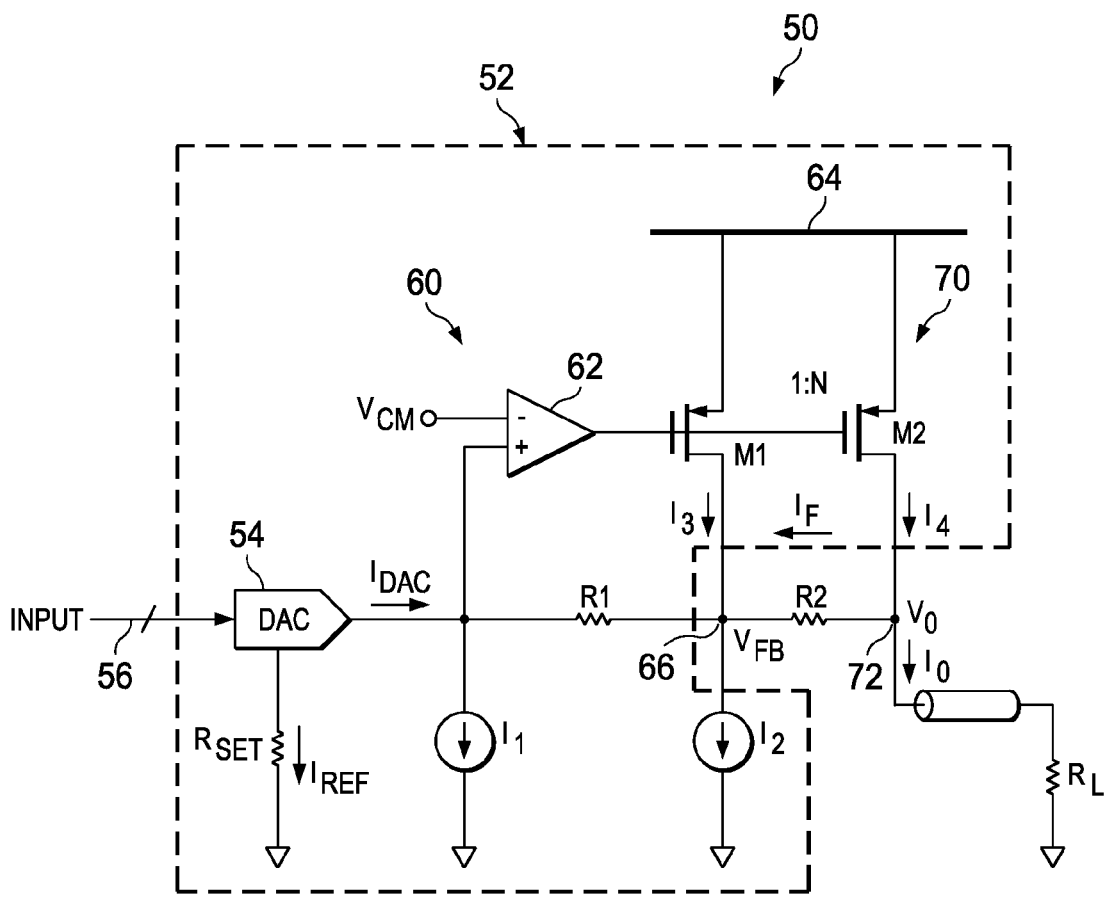
FIG. 2 illustrates another example of a video driver system that can be implemented in accordance with an aspect of the invention.

FIG. 2 depicts a video system 50 that can be implemented on an IC chip 52 according to an aspect of the present invention. The system includes a DAC 54 that provides an analog output current $I_{DAC}$ that varies as a function of a digital INPUT signal 56 and a predetermined DAC reference current $I_{REF}$. The DAC reference current $I_{REF}$ can be set by a resistor $R_{SET}$. $R_{SET}$ can be an internal resistance, an external resistance or a combination of internal and external resistances. The digital INPUT can be provided to the DAC 54 by a video encoder (not shown), such as a multi-bit (e.g., about 10 bits or greater) digital input code according to application requirements.

A current-to-voltage converter, indicated at 60, converts $I_{DAC}$ to a corresponding voltage $V_{FB}$. The current-to-voltage converter 60 can be implemented as a loop includes an op-amp 62, transistor M1 and a resistor $R_1$. A common mode voltage $V_{CM}$ of the DAC 54 is provided to the inverting input of the op-amp 62 and the non-inverting input of the op-amp is coupled to the output of the DAC. The transistor M1 is coupled between a voltage rail 64 and a node 66 that provides a feedback voltage $V_{FB}$. The op-amp 62 drives gates of transistors M1 and M2. The transistor M1 provides current $I_3$ to the node 66 based on the voltage provided by the op-amp 62, which voltage varies as a function of $I_{DAC}$. The resistor $R_1$ is coupled between the output of the DAC 54 and the node 66. The resistor $R_1$ performs current-to-voltage conversion based on $I_{DAC}$ to provide $V_{FB}$. The resistor $R_1$ can be implemented as an on-chip resistor (e.g., an NWELL resistor in a CMOS process). Alternatively or additionally, the resistor $R_1$ could include an external resistance. DC current sources provide (e.g., sink) current $I_1$ and $I_2$, respectively, away from the output of the DAC and from the node 66.

The video driver system 50 also includes active termination circuitry 70 configured to synthesize an output impedance at an output 72 that substantially matches a load impedance $R_L$ to which the output is coupled. The load impedance $R_L$, for instance, corresponds to the impedance of line for a video output (e.g., about 75Ω). The active termination circuitry 72 can be implemented as a hybrid circuit that includes the transistors M1 and M2 and resistors $R_1$ and $R_2$. The areas of the transistors M1 and M2 are matched transistors according to a ratio 1:N. The transistors M1 and M2 of the active termination circuitry 72 thus can be controlled by the output of the op-amp 62 to maintain an output impedance that substantially matches the output impedance $R_L$. Other types and configurations of active termination circuits could also be utilized. The performance of the driver system 50 will vary according to the parameters of the system 50.

By way of further example, the current-to-voltage converter 60 and the active termination circuitry 70 can be configured to implement a video driver according to design specifications, such as voltage swing at the output 72, $V_{OPP}$, and the DAC peak current, $I_{DAC\_PP}$. The parameters of the other system components can be set based on such specifications, including the mirror ratio of N, DC voltage at $V_{FB}$ and $V_O$ and the DC currents of $I_1$, $I_2$. For instance, the video driver system 50 can be described by the following set of equations:

$$\begin{cases} V_{FB} = V_{CM} + (I_1 - I_{DAC})R_1 = \underbrace{\{V_{CM} + I_1 R_1\}}_{DCTERM} - \underbrace{i_{DAC}R_1}_{ACTERM} & \text{Eq. 1} \\ V_O = I_O R'_L \\ I_F = \dfrac{V_O - V_{FB}}{R_2} \\ I_3 = I_2 + (I_1 - I_{DAC}) - I_F \\ I_4 = NI_3 \\ I_O = I_4 - I_F \end{cases}$$

From the foregoing Eq. 1, the DC transfer function ($V_O$) of the video driver system 50 can be expressed as follows:

$$V_O = \underbrace{\left\{ \dfrac{NR_2 + (N+1)R_1}{R_2 + (N+1)R_L} I_1 R_L + \dfrac{NR_2}{R_2 + (N+1)R_L} I_2 R_L + \dfrac{(N+1)R_L}{R_2 + (N+1)R_L} V_{CM} \right\}}_{DC\ TERM} - I_{DAC} N \underbrace{\dfrac{R_2 + \dfrac{(N+1)}{N} R_1}{R_2 + (N+1)R_L}}_{AC\ TERM}^{EQUIVALENT\ AC\ LOAD} R_L \qquad \text{Eq. 2}$$

The DC terms in Eqs. 1 and 2, which are dictated by the currents of $I_1$ and $I_2$, define the DC operating points at nodes 64 and 72, respectively. Accordingly, by adjusting $I_1$ and $I_2$, flexibility in the DC condition can be achieved to optimize the linearity performance of the video driver system 50. To provide proper output impedance matching and keep $V_O$ and $V_{FB}$ tracking each other, the nominal value for resistors $R_1$ and $R_2$ can be chosen as a function of N and the load resistance $R_L$, such as follows:

$$R_1 = NR_L, \text{ and} \qquad \text{Eq. 3}$$

$$R_2 = (N+1)R_L. \qquad \text{Eq. 4}$$

Therefore, by appropriate substitution, $V_{FB}$ from Eq. 1 and Eq. 2 can be re-written as follows:

$$V_{FB} = \underbrace{\{V_{CM} + I_1 NR_L\}}_{DC\ TERM} - \underbrace{I_{DAC} NR_L}_{AC\ TERM} \qquad \text{Eq. 5}$$

$$V_{OUT} = \underbrace{\left\{ I_1 NR_L + \dfrac{N}{2} I_2 R_L + \dfrac{V_{CM}}{2} \right\}}_{DC\ TERM} - \underbrace{I_{DAC} NR_L}_{AC\ TERM} \qquad \text{Eq. 6}$$

Given the swing (peak-peak voltage) of the DAC output, $I_{DACPP}$, and the desired output voltage swing, $V_{OPP}$, we can define the value of N by:

$$N = \frac{V_{OPP}}{I_{DACPP}R_L} \quad \text{Eq. 7}$$

It will be appreciated that the system 50 can be designed with $V_O$ and $V_{FB}$ being close so as to improve the linearity of the driver. Therefore, combining the DC terms in Eqs. 1 and 2, the values of the DC currents $I_1$ and $I_2$ can be provided as follows:

$$I_1 = \frac{V_{CMO} - V_{CM}}{NR_L} \quad \text{Eq. 8}$$

$$I_2 = \frac{V_{CM}}{NR_L} \quad \text{Eq. 9}$$

where $V_{CMO}$ is the desired DC voltage at the $V_O$ and $V_{FB}$ when the DAC output current equals 0.

Eqs. 7, 8 and 9 thus can be employed to define a set of design parameters for the video driver system 50. It will be appreciated that, non-idealities should be considered in designing the system 50 since the foregoing derivation has assumed that the amplifier and the current mirror are ideal. The non-linearity of the video driver 50 can come from various sources, including from the amplifier, the current mirror output driver, the DC bias current source and the integrated NWELL resistors.

Additionally, in practice, current sources $I_1$ and $I_2$ have finite output impedance, which also introduces non-linearity to the video driver system. For instance, current source $I_1$ connect to a virtual ground node and its current output can be treated as constant. However, current source $I_2$ sees large signal swing at $V_{FB}$. Although the $I_2$ variation, which is modulated by the signal at $V_{FB}$, does not introduce non-linearity directly since that variation itself is just a replica of the signal. The DC unbalance due to the disproportion of $I_1$ and $I_2$ tends introduces non-linearity. Those skilled in the art will appreciate various techniques can be utilized to reduce the non-linearity generated by this and other effects. Other process variations can introduce errors and degrade performance, such as including gain error. In an embodiment where the resistor R1 is an NWELL resistor, significant changes in resistor values can occur across temperature and process corners. As one example, in a 65 nm process, the NWELL resistor value can change over ±30% across temperature and processor corners.

To explain the effects of process variations due to variation in the NWELL resistor, the foregoing model of the driver system 50 is modified in the following discussion. Instead of using the nominal value $R_1 = NR_L$ and $R_2 = (N+1)R_L$ for $R_1$ and $R_2$, by describing $R_1 = MR_L$ and $R_2 = (M+1)R_L$. Here M deviates from its nominal value N to account for the process and temperature variations. Assuming the current mirror has a fixed gain N, it can be shown that the change in the drain-to-source voltage ($\Delta V_{ds}$) between M1 and M2 can be expressed as follows:

$$\Delta V_{ds} = V_O - V_{FB} = \frac{(N-M)(M+1)}{M+N+2} R_L I_{DAC} \quad \text{Eq. 10}$$

It thus can be shown that the $V_{ds}$ of the $M_1$ and $M_2$ are different. Furthermore, $\Delta V_{ds}$ is a function of the input signal $I_{DAC}$ from the DAC. In practice, the $\Delta V_{ds}$ generates an input dependent current mirror gain variation, which can produce additional non-linearity. The AC input dependent current mirror gain can be represented as follows:

$$N = \frac{I_4}{I_3} \quad \text{Eq. 11}$$

$$= \frac{\frac{1}{2}\mu_p C_{ox} N_o \frac{W}{L}(V_{gs} - V_t)(1 + \lambda V_{ds4})}{\frac{1}{2}\mu_p C_{ox} \frac{W}{L}(V_{gs} - V_t)(1 + \lambda V_{ds3})}$$

$$= N_o \frac{\left(1 + \lambda \frac{N(M+1) + M(N+1)}{N+M+2} R_L I_{DAC}\right)}{(1 + \lambda R_L M I_{DAC})}$$

$$\approx N_o \left(1 + \lambda \underbrace{\frac{(N-M)(M+1)}{M+N+2} R_L I_{DAC}}_{\text{Non-linear Term}}\right)$$

From Eq. 11, it becomes evident that a greater amount of non-linearity is introduced the larger the deviation of M from N.

From the foregoing analysis, it can be shown that variation in the load resistance $R_L$ introduces the same effect (e.g., nonlinearity) as does variation in the NWELL resistor $R_1$ mentioned above. That is, the variation in $R_L$ also creates an input dependent $\Delta V_{ds}$, and hence causes an input dependent current mirror gain. For example, the $\Delta V_{ds}$ due to variation in $R_L$ can be represented as follows:

$$\Delta V_{ds} = V_O - V_{FB} = \Delta R_L I_{DAC} \quad \text{Eq. 12}$$

and the resulting the current mirror gain can be expressed as:

$$N \approx N_o \left(1 + \underbrace{\lambda \Delta R_L I_{DAC}}_{\text{Non-linear Term}}\right) \quad \text{Eq. 13}$$

As mentioned above, the term $\Delta R_L$ is the variation in the load impedance. In the video driver system 50, the signal dependent current mirror gain can also provide a significant source for the non-linearity. A fixed current mirror gain across the signal swing over all the process and temperature corners can be implemented to mitigate non-linearity due to current mirror gain.

As shown in the foregoing analysis, the non-linearity of the current mirror gain is created by the signal dependent $\Delta V_{ds}$. In both Eqs. 11 and 13, it is shown that the current mirror gain variation is determined by two terms, $\Delta V_{ds}$ and $\lambda$. Therefore, two methods can be employed to mitigate the gain variation. For instance, trimming can be utilized to track variation in the NWELL resistor or load resistance. In that way, $\Delta V_{ds}$ can be forced to be negligible. A second approach is to reduce $\lambda$, such that the current mirror gain becomes insensitive to the $\Delta V_{ds}$.

Figure 3:
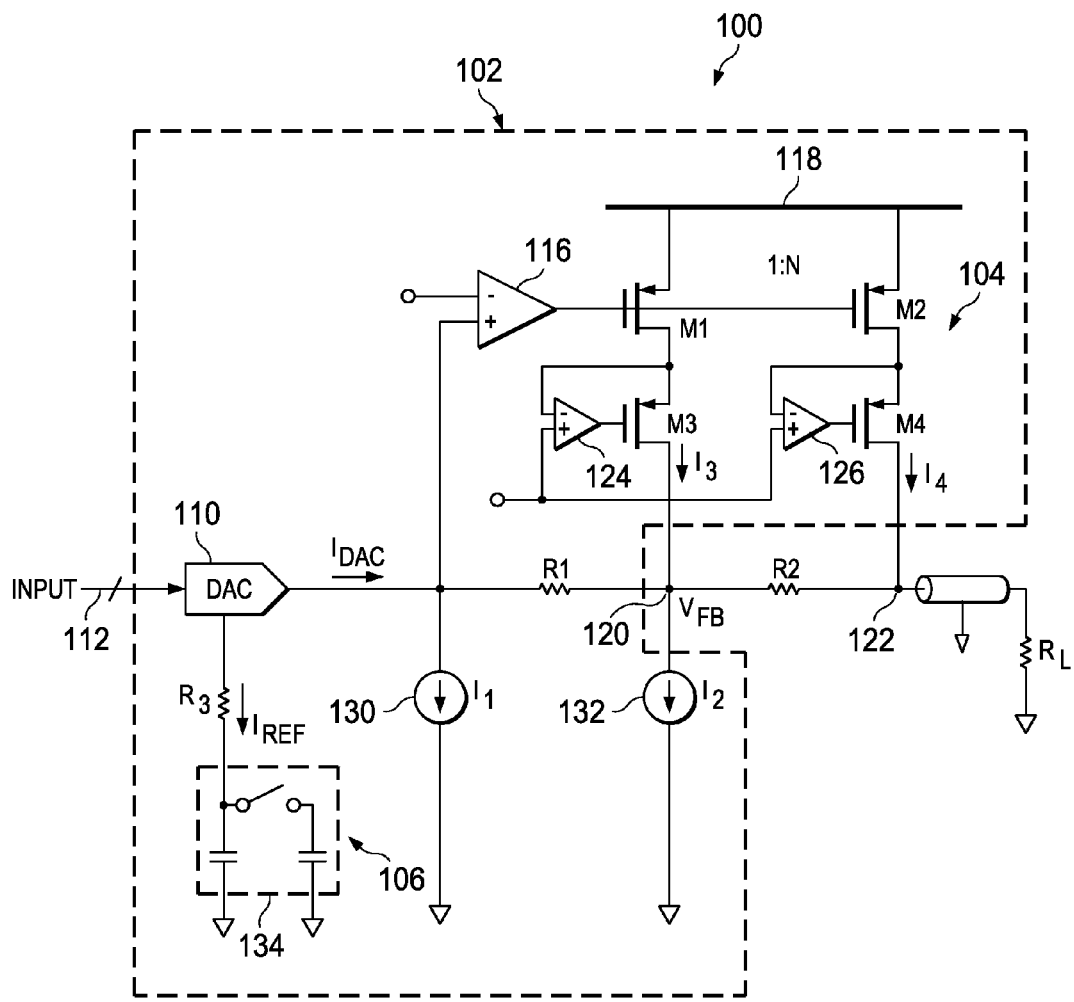
FIG. 3 illustrates still another example of a video driver system that can be implemented in accordance with an aspect of the invention.

FIG. 3 depicts another example embodiment of a video system 100 that can implement an analog video driver 102 according to an aspect of the present invention. The driver 102 is similarly configured to the approach of FIG. 2, but also includes additional circuitry 104 to improve linearity. The circuitry 104 can be implemented as a regulated (e.g., a gate-boost) current mirror. Additionally, the system 102 includes circuitry 106 to mitigate gain error in the system. For sake of consistency of explanation, the circuitry 104 and 106 will be described in the context of various components that are represented by many reference characters previously introduced with respect to FIG. 2.

The system 100 thus includes a current DAC 110 that is configured to provide an analog output current $I_{DAC}$ that varies as a function of a digital INPUT signal 112 and a predetermined DAC reference current $I_{REF}$. The DAC reference current $I_{REF}$ can be set according to the configuration of the circuitry 106.

In the illustrated example of FIG. 3, the driver 102 includes an op-amp 116 that drives gates of transistors M1 and M2 based on the $I_{DAC}$ current. The areas of the transistors M1 and M2 are matched transistors according to a ratio 1:N. A common mode voltage $V_{CM}$ of the DAC 110 is provided to the inverting input of the op-amp 116, and the non-inverting input is coupled to the output of the DAC. The regulated current mirror 104 is coupled between the transistors M1 and M2 and respective nodes 120 and 122. In particular, transistor M1 is coupled in series with transistor M3 of the regulated current mirror 104 between a voltage rail 118 and the node 120. A feedback voltage $V_{FB}$ is provided at 120 based on the voltage drop across the resistor $R_1$ and $I_{DAC}$. Transistor M2 is coupled in series with transistor M4 of the regulated current mirror 104 between the voltage rail 118 and the node 122, where node 122 defines an output of the driver that provides the output voltage $V_{OUT}$. The regulated current mirror 104 also includes op-amps 124 and 126 that drive the gates of M3 and M4, respectively, based on a reference voltage (from the DAC 110) relative to the drain voltages provided respectively by M1 and M2. The current mirror circuitry 104 thus provides regulated currents $I_3$ and $I_4$ to the nodes 120 and 122.

A resistance $R_1$ is coupled between the output of the DAC 110 and the node 120. A second resistance $R_2$ is coupled between nodes 120 and 122. In the illustrated example, the resistor $R_1$ is depicted as an internal resistance (e.g., an NWELL resistor) and the resistor $R_2$ as an external resistor. It is to be understood that each of the resistors $R_1$ and $R_2$ could be implemented as internal resistances, external resistances or a combination of internal and external resistances. For purposes of consistency, the following discussion assumes that $R_1$ is implemented as an NWELL internal resistance. DC current sources 130 and 132 provide DC currents $I_1$ and $I_2$.

The op-amp 116, M1, M3, op-amp 124 and resistor $R_1$ define a current-to-voltage conversion loop. An impedance matching loop is defined by the transistors M1, M2, M3, M4 and $R_2$. The impedance matching loop also is controlled by the output of the op-amp 116 and the resistor $R_1$ to provide active termination circuitry that is configured to synthesize an output impedance at an output 122 that substantially matches a load impedance $R_L$ to which the output is coupled. The load impedance $R_L$, for instance, corresponds to the impedance of line for a video output (e.g., about 75Ω). The transistors M1 and M2 of the active termination circuitry 72 thus can be controlled by the output of the op-amp 62 to maintain an output impedance that substantially matches the output impedance $R_L$.

Linearity in the system 100 can be improved due to the regulation of current by the gate-boost current mirror 104. From the foregoing example, is can be shown that the λ of the gate-boosting current mirror 104 is $Ag_{mCAS}R_{CAS}$ times smaller than the one of the simple current mirror. Here "A" is the gain of the boost amplifier, $g_{mCAS}$ and $R_{CAS}$ correspond to the transconductance and output impedance of the cascode transistor, respectively. By using the gate-boosting current mirror, total harmonic distortion can be improved significantly (e.g., by about 22 dB). Since the current mirror gain is insensitive to the difference in $V_{OUT}$ and $V_{FB}$ in this structure, it is also substantially immune to the load impedance variation. Those skilled in the art will appreciate that when the gate-boost current mirror is employed in the driver system, $R_2$ should be external to ensure the output impedance matching. This is because the output impedance of the hybrid driver is given can be expressed as follows:

$$R_O = \frac{R_2}{N+1} \quad \text{Eq. 14}$$

The large variation in the NWELL resistor cannot provide accurate impedance matching that is required in most of the applications.

Another performance consideration relates to the gain variation caused by large variation in the on-chip NWELL resistor. For the gate-boosting current mirror structure, the AC transfer function $V_O$ can be re-written as in Eq. 15, given that external resistor is used for $R_2$, and an NWELL resistor is used for $R_1$. Hence, $R_2$ (being external) has a fixed value $(N+1)R_L$ and $R_1=MR_L$, where M has a nominal value of N and varies with the process and temperature corners as mentioned above.

$$V_O = \underbrace{\left\{\frac{N*RL+R_1}{2}I_1 + \frac{N}{2}I_2R_L + \frac{1}{2}V_{CM}\right\}}_{DC\,TERM} -$$

$$i_{IN} * \underbrace{\frac{\overbrace{N*RL+R_1}^{EQUIVALENT\,AC\,LOAD}}{2}}_{AC\,TERM} \quad (27a) \quad \text{Eq. 15}$$

$$V_O = \underbrace{\frac{M+N}{2}}_{Variation\,Factor} \cdot I_{DAC}R_L \quad (27b) \quad \text{Eq. 16}$$

For the transistor trimming structure, all the resistors are integrated, which provides $R_1=MR_L$ and $R_2=(M+1)R_L$. With trimming, the current mirror gain is also tuned to be M. Therefore, the AC transfer function in this case can be expressed as follows;

$$V_O = \underbrace{M}_{Variation\,Factor} \cdot I_{DAC}R_L \quad \text{Eq. 17}$$

Assuming that the NWELL has over ±30% variation across process temperature corners, the value of M can vary significantly. From Eqs. 16 and 17, it is shown that the swing at $V_O$ changes commensurate with the M variation, which results in over ±15% gain error for the gate-boosting current mirror video driver and ±30% gain error for the trimming video driver.

The only other variable in Eqs. 15, 16 and 17 is the input current $I_{DAC}$ that is provided by the DAC 110. To mitigate this gain error issue, variation can be introduced into the $I_{DAC}$ to compensate the M variation. Since $I_{DAC}$ is the output from the DAC, it is a function of the reference current $I_{REF}$ used in the current steering the DAC. By way of example, the input current from the DAC ($I_{DAC}$ in FIG. 3) can be expressed as follows:

$$i_{IN} = \frac{I_{ref}}{8}\left(63 + \frac{15}{16}\right) \quad \text{Eq. 18}$$

$I_{ref}$ is obtained by applying a fixed voltage from bandgap reference on a reference resistor. Thus, the reference current can be represented as $$I_{ref} = \frac{V_{BG}}{R_{ref}}.$$

Combining Eqs. 15, 16, 17 and 18, it can be shown that gain error can be substantially cancelled by introducing the same variation factor to the reference resistance that is utilized to generate the reference current.

By way of example, referring back to FIG. 3, the circuitry 106 can be implemented as a resistance $R_{SET}$ that includes an NWELL resistor $R_3$ in series with a switched-capacitor resistor network 134. The switched-capacitor resistor network 134 provides a substantially constant resistor that exhibits little variation due to temperature and processor variations (as compared to the large variation in NWELL resistance). The circuitry 106 thus can be configured to compensate for the gain error in the gate-boosting current mirror video driver 104. With the series resistance provided by the circuitry 106, the reference current IREF becomes:

$$I_{ref} = \frac{V_{BG}}{R_{nwell} + R_{sw}}, \quad \text{Eq. 19}$$

where $R_{nwell}$ is the varying NWELL resistor and $R_{sw}$ is the constant switched-cap resistor. Both resistors are designed for the same nominal value.

Since all the on-chip NWELL resistors varies in the same direction across the process and temperature corners, $I_{ref}$ can be re-written as:

$$I_{ref} = \frac{V_{BG}}{(M+N)R_L \cdot K}, \quad \text{Eq. 20}$$

where K is a scaling factor $I_{ref}$ can be substituted into Eq. 16 to provide the following transfer function:

$$\begin{aligned} V_O &= \frac{M+N}{2} I_{DAC} R_L \quad \text{Eq. 21} \\ &= \frac{M+N}{2} \frac{V_{BG}}{(M+N)R_L \cdot 8 \cdot K} \left(63 + \frac{15}{16}\right) R_L \\ &= \underbrace{\frac{V_{BG}}{16 \cdot K} \left(63 + \frac{15}{16}\right)}_{\text{Constant}} \end{aligned}$$

Thus, it is shown that by employing an internal NWELL resistance to generate the reference current IREF for the DAC 110, the gain error can be substantially cancelled. From simulation, it can be shown that the gain error can be reduced to approximately ±3%. The remaining gain error results form the variation of the switched capacitor, which can be further reduced by careful design and layout for the capacitor.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. An integrated on-chip system, comprising:
    means for converting a digital input signal to a corresponding analog current;
    means for converting the analog current to a corresponding analog voltage;
    means for actively matching impedance at an output of the system with a load impedance and for providing an output voltage at the output corresponding to a buffered indication of the corresponding analog voltage, the means for converting the analog current and the means for actively matching sharing at least one component in the integrated on-chip system.

2. The system of claim 1, wherein the shared component comprises an internal resistance in the on-chip system.

3. An integrated on-chip system, comprising:
    means for converting a digital input signal to a corresponding analog current;
    means for converting the analog current to a corresponding analog voltage;
    means for substantially matching impedance at an output of the system with a load impedance and for providing an output voltage at the output corresponding to a buffered indication of the corresponding analog voltage, the means for converting the analog current and the means for substantially matching sharing at least one component in the integrated on-chip system; and
    means for regulating current in the means for actively matching so as to improve linearity in the output voltage.

4. An integrated on-chip system, comprising:
    means for converting a digital input signal to a corresponding analog current;
    means for converting the analog current to a corresponding analog voltage;
    means for actively matching impedance at an output of the system with a load impedance and for providing an output voltage at the output corresponding to a buffered indication of the corresponding analog voltage, the means for converting the analog current and the means for actively matching sharing at least one component in the integrated on-chip system;
    means for regulating current in the means for actively matching so as to improve linearity in the output voltage; and
    means for generating a reference current that is utilized by the means for converting to generate the analog current, the means for generating the reference current including at least one internal component of the same type as the shared component, so as to mitigate gain error.

5. An integrated on-chip system, comprising:
    means for converting a digital input signal to a corresponding analog current;
    means for converting the analog current to a corresponding analog voltage;
    means for substantially matching impedance at an output of the system with a load impedance and for providing an output voltage at the output corresponding to a buffered indication of the corresponding analog voltage, the means for converting the analog current and the means for substantially matching sharing at least one component in the integrated on-chip system, wherein the at least one shared component in the integrated on-chip system comprises an internal NWELL resistance.

6. The system of claim 5, wherein the means for substantially matching further comprises an amplifier system, the system further comprising:
   means for regulating current in the means for actively matching; and
   means for generating a reference current through an NWELL resistance, the means for converting employing the reference current to generate the analog current, such that gain error in the means for actively matching is mitigated.

7. A method for driving a video signal to an output, comprising:
   converting a digital input signal, by a first on-chip converter, to a corresponding analog current based on a reference current;
   converting the analog current, by an on chip current-to-voltage converter, to a corresponding analog voltage at a feedback node based on a voltage across an on-chip resistor; and
   actively matching impedance at the output, by on-chip circuitry, and providing an analog output voltage at the output by buffering the corresponding analog voltage at the feedback node to the output.

8. A method for driving a video signal to an output, comprising:
   converting a digital input signal, by a first on-chip converter, to a corresponding analog current based on a reference current;
   converting the analog current, by an on chip current-to-voltage converter, to a corresponding analog voltage at a feedback node based on a voltage across a first on-chip resistor;
   actively matching impedance at the output, by on-chip circuitry, and providing an analog output voltage at the output by buffering the corresponding analog voltage at the feedback node to the output; and
   generating a reference current through a second on-chip resistor, the first on-chip converter generating the analog current as a function of the reference current such that gain error is mitigated.

9. The method of claim 8, wherein each of the first on-chip resistor and the second on-chip-resistor comprises an NWELL resistor.

10. The method of claim 7, wherein the digital input signal comprises a multi-bit video signal.

11. A method for driving a video signal to an output, comprising:
   converting a digital input signal, by a first on-chip converter, to a corresponding analog current based on a reference current;
   converting the analog current, by an on chip current-to-voltage converter, to a corresponding analog voltage at a feedback node based on a voltage across a first on-chip resistor;
   actively matching impedance at the output, by on-chip circuitry, and providing an analog output voltage at the output by buffering the corresponding analog voltage at the feedback node to the output; and
   generating a reference current through a second on-chip resistor comprising an NWELL resistance in series with a switched-capacitor resistance, the first on-chip converter generating the analog current as a function of the reference current such that gain error is mitigated.

12. A system comprising:
   a digital-to-analog converter that provides an analog input current based on a digital input signal;
   a current-to-voltage converter circuit that converts the analog input current to a corresponding analog voltage; and
   active termination circuitry configured to synthesize an output impedance at an output thereof that substantially matches a load impedance to which the output is coupled, the active termination circuitry buffering the analog voltage to the output,
   the digital-to-analog converter, the current-to-voltage converter circuit and at least a portion of the active termination circuitry being implemented on a single integrated circuit, and the current-to-voltage converter and the active termination circuitry sharing at least an internal resistance in the single integrated circuit.

13. The system of claim 12, wherein the shared internal resistance comprises an NWELL resistance.

14. A system comprising:
   a digital-to-analog converter that provides an analog input current based on a digital input signal;
   a current-to-voltage converter circuit that converts the analog input current to a corresponding analog voltage; and
   active termination circuitry configured to synthesize an output impedance at an output thereof that substantially matches a load impedance to which the output is coupled, the active termination circuitry buffering the analog voltage to the output, the digital-to-analog converter, the current-to-voltage converter circuit and at least a portion of the active termination circuitry being implemented on a single integrated circuit, and the current-to-voltage converter and the active termination circuitry sharing in the single integrated circuit at least a first NWELL resistance, the system further comprising a reference generator circuit coupled to generate a reference current for the digital-to-analog converter, the reference generator circuit comprising a second NWELL resistance configured to correct gain error due to process variations in the first NWELL resistance.

15. The system of claim 14, wherein the reference generator circuit further comprises a switched-capacitor resistance in series with the second NWELL resistance for generating the reference current for the digital-to-analog converter.

* * * * *